United States Patent
Wei et al.

(10) Patent No.: US 9,263,524 B2
(45) Date of Patent: Feb. 16, 2016

(54) SEMICONDUCTOR MATERIALS, APPARATUSES AND METHODS

(75) Inventors: Peng Wei, Stanford, CA (US); Zhenan Bao, Stanford, CA (US); Benjamin D. Naab, Menlo Park, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 785 days.

(21) Appl. No.: 13/440,714

(22) Filed: Apr. 5, 2012

(65) Prior Publication Data

US 2012/0256296 A1  Oct. 11, 2012

Related U.S. Application Data

(60) Provisional application No. 61/472,120, filed on Apr. 5, 2011.

(51) Int. Cl.
| | | |
|---|---|---|
| *H01L 51/54* | (2006.01) | |
| *H01B 1/12* | (2006.01) | |
| *H01L 29/34* | (2006.01) | |
| *H01L 21/322* | (2006.01) | |
| *H01L 29/16* | (2006.01) | |
| *H01L 29/778* | (2006.01) | |
| *B82Y 30/00* | (2011.01) | |
| *B82Y 40/00* | (2011.01) | |
| *H01L 51/00* | (2006.01) | |
| *H01L 51/05* | (2006.01) | |
| *B82Y 10/00* | (2011.01) | |

(52) U.S. Cl.
CPC .............. *H01L 29/1606* (2013.01); *B82Y 10/00* (2013.01); *B82Y 30/00* (2013.01); *B82Y 40/00* (2013.01); *H01L 29/778* (2013.01); *H01L 51/0048* (2013.01); *H01L 51/0566* (2013.01)

(58) Field of Classification Search
None
See application file for complete search history.

(56) References Cited

U.S. PATENT DOCUMENTS

| | | | |
|---|---|---|---|
| 2007/0018154 A1 | 1/2007 | Bae et al. | |
| 2008/0283826 A1 | 11/2008 | Zheng et al. | |
| 2010/0187515 A1 | 7/2010 | Limmert et al. | |
| 2011/0248267 A1 | 10/2011 | Wei et al. | |

FOREIGN PATENT DOCUMENTS

| | | | |
|---|---|---|---|
| WO | WO 2009/000237 | 12/2008 | |
| WO | WO 2010029542 A1 * | 3/2010 | ............... H01L 51/00 |

OTHER PUBLICATIONS

Li et al. "Leuco Crystal Violet as a Dopant for n-Doping of Organic Thin Films of Fullerene C60" J. Phys. Chem. B 2004, 108, 17076-17082. Date of web publication: Oct. 8, 2004.*

Wei et al. "Use of a 1 H-Benzoimidazole Derivative as an n-Type Dopant and To Enable Air-Stable Solution-Processed n-Channel Organic Thin-Film Transistors" J. Am. Chem. Soc. 2004, 132, 8852-8853. Date of web publication: Jun. 16, 2010.*

Nollau, A., Pfeiffer, M., Fritz, T., & Leo, K., "Controlled n-Type Doping of a Molecular Organic Semiconductor: Naphthalenetetracarboxylic dianhydride (NTCDA) Doped with bis(ethylenedithio)-tetrathiafulvalene (BEDT-TTF)." *J. Appl. Phys.* vol. 87, pp. 4340-4343, (2000).

Maennig, B.; Pfeiffer, M.; Nollau, A.; Zhou, X.; Leo, K. and Simon, P., "Controlled p-Type Doping of Polycrystalline and Amorphous Organic Layers: Self-consistent Description of Conductivity and Field-effect Mobility by a Microscopic Percolation Model." *Phys. Rev. B*, 64, No. 195208, (2001).

Gao, W. and Kahn, A., "Controlled p-doping of Zinc Phthalocyanine by Coevaporation with Tetrafluorotetracyanoguinodimethane: A Direct and inverse Photoemission Study." *Appl. Phys. Lett.*, vol. 79, pp. 4040, (2001).

Werner, A. G.; Li, F.; Harada, K.; Pfeiffer, M.; Fritz, T. and Leo, K., "Pryonin B as a Donor for n-type Doping of Organic Thin Films." *Appl. Phys. Lett.*, vol. 82, pp. 4495-4497, (2003).

Ouyang, J.; Xu, Q.; Chu, C.-W.; Yang, Y.; Li, G. and Shinar, J., "On the Mechanism of Conductivity Enhancement in poly(3,4-ethylenedioxythiophene):poly(styrene sulfonate) Film Through Solvent Treatment." *Polymer*, 45, pp. 8443-8450, (2004).

Drechsel, J.; Männig, B.; Kozlowski, F.; Pfeiffer, M.; Leo, K. and Hoppe, H., "Efficient Organic Solar Cells Based on a Double p-i-n. Architecture Using Doped Wide-Gap Transport Layers." *Appl. Phys. Lett.*, 86, No. 244102, (2005).

S. Tanaka et al. "Doping Effect of Tetrathianaphthacene Molecule in Organic Semiconductors on Their Interfacial Electronic Structures Studied by UV Photoemission Spectroscopy." *Japanese J. Appl. Phys.* 44(6a) 3760 (2005).

Singh, T. B. et al., "Fabrication and Characterization of Solution-Processed Methanofullerene-Based Organic Field-Effect Transistors." *J. Appl. Phys.* 97, 083714, (2005).

Li, F.H., et al., "Acridine Orange Base as a Dopant for n Doping of C60 Thin Films." *J. Appl. Phys.* 100, 023716, (2006).

C. Chan et al. "N-type doping of an electron-transport material by controlled gas-phase incorporation of cobaltocene." *Chem. Phys. Lett.* 431, 67 (Sep. 2006).

Yun, M. et al., "Capacitance-Voltage Characterization of Polyfluorene-Based Metal-Insulator-Semiconductor Diodes." *Appl. Phys. Lett.* 89, 013506, (2006).

Zhang, X. H., Domercq, B. & Kippelen, B., "High-performance and Electrically Stable C-60 Organic Field-Effect Transistors." *Appl. Phys. Lett.*, 91, 092114, (2007).

Zhang, X. H. & Kippelen, B., "High-performance C60 n-Channel Organic Field-Effect Transistors Through Optimization of Interfaces." *J. Appl. Phys.* 104, 104504, (2008).

(Continued)

*Primary Examiner* — Andrew L Bohaty
(74) *Attorney, Agent, or Firm* — Crawford Maunu PLLC

(57) ABSTRACT

Various methods and apparatuses involving salt-based compounds and related doping are provided. In accordance with one or more embodiments, a salt-based material is introduced to a semiconductor material, and is heated to generate a neutral compound that dopes the semiconductor material. Other embodiments are directed to semiconductor materials with such a neutral compound as an impurity that affects electrical characteristics therein.

22 Claims, 11 Drawing Sheets

(56) References Cited

OTHER PUBLICATIONS

Chan, C. K.; Zhao, W.;Barlow, S.; Marder, S. and Kahn, A., "Decamethylcobaltocene As An Effieient n-Dopant In Organic Electronic Materials and Devices." *Org. Electron.*, 9, pp. 575-581, (2008).

P. Wöbkenberg et al., "High mobility n-channel organic field-effect transistors based on soluble $C_{60}$ and $C_{70}$ fullerence derivative." Synthetic Metals 158, pp. 468-472 (2008).

Chan, C. K.; Zhao, W.; Kahn, A. and Hill, I. G., "Influence of Chemical Doping on the Performance of Organic Photovoltaic Cells." *Appl. Phys. Lett.*, 94, No. 203306, (2009).

S. Reineke et al. "White organic light-emitting diodes with fluorescent tube efficiency." *Nature* 459, 234 (May 2009).

Yamagishi, M.; Tominari, Y.; Uemura, T. and Takeya, J., "Air-Stable n-Channel Single-Crystal Transistors with Negligible Threshold Gate Voltage." *Appl. Phys. Lett.*, 94, No. 053305, (2009).

Y. Wang et al., "Supercapacitor Devices Based on Graphene Materials," J. Phys. Chem. 113, pp. 13103-13107 (2009).

K. A. Mkhoyan et al., Atomic Electronic Structure of Graphene-Oxide, Nato Lett. 9 (3), pp. 1058-1063 (2009).

P. Meduri et al., "Hybrid Tin Oxide Nanowires as Stable and High Capacity Anodes for Li-Ion Batteries," Nano Lett. 9 (2), pp. 612-616 (2009).

J. H. Oh et al. "Molecular n-type doping for air-stable electron transport in vacuum-processed n-channel organic transistors." *Applied Physics Letters* 97, 243305 (Dec. 2010).

Timmreck, R.; Olthof, S.; Leo, K. and Riede, M. K., "Highly Doped Layers as Efficient Electron-Hole Recombination Contacts for Tandem Organic Solar Cells." *J. Appl. Phys.*, 108, No. 033108, (2010).

Meiss, J.; Menke, T.; Leo, K.; Uhrich, C.; Gnehr, W.-M.; Sonntag, S.; Pfeiffer, M. and Riede, M., "Highly Efficient Semitransparent Tandem Organic Solar Cells with Complementary Absorber Materials." *Appl. Phys. Lett.*, 99, No. 043301, (2011).

Meerheim, R.; Olthof, S.; Hermenau, M.; Scholz, S.; Petrich, A.; Tessler, N.; Solomeshch, O.; Lussem, B.; Riede, M. and Leo, K., "Investigation of C60F36 As Low-Volatility P-Dopant In Organic Optoelectronic." *J. Appl.Phys.*, 109, No. 103102, (2001).

\* cited by examiner

SEMICONDUCTOR MATERIALS, APPARATUSES AND METHODS

RELATED DOCUMENTS

This patent document claims benefit under 35 U.S.C. §119 to U.S. Provisional Patent Application Ser. No. 61/472,120, entitled "n-Type Doped Organic Materials and Methods Therefor" and filed on Apr. 5, 2011; this patent document and the Appendix filed in the underlying provisional application, including the references cited therein, are fully incorporated herein by reference.

FEDERALLY-SPONSORED RESEARCH AND DEVELOPMENT

This invention was made with Government support under contract FA9550-09-1-0256 awarded by the Air Force Office of Scientific Research. The U.S. Government has certain rights in this invention.

FIELD

The present invention relates generally to semiconductor materials, electronic devices, and related methods.

BACKGROUND

Electronic devices, such as organic thin-film transistors (OTFTs) and other organic semiconductors (OSCs) have attracted a great deal of attention because of their potential applications in low-cost, large-area and flexible electronics. Organic semiconductors are commonly referred to as either p-channel (hole-transporting) or n-channel (electron-transporting) depending on which type of charge carrier is dominant for the charge transport.

While organic semiconductors have been readily implemented for a variety of applications, both p-channel and n-channel organic semiconductors have been challenging to manufacture and implement in the context of various applications. For instance, the energetically high-lying lowest unoccupied molecular orbital (LUMO) levels in most organic semiconductors hinder the efficient injection of electrons. n-Type doping can be applied to increase the electron density and improve the electron injection in semiconductor devices. In n-channel OTFTs with efficient doping, electrons can be transferred from the high-lying highest occupied molecular orbitals (HOMOs) of dopants to the LUMOs of organic semiconductors by n-type doping. However, such dopants are susceptible to oxidation in air.

While various n-type dopants have been used with organic semiconductors, many have been challenging to implement. For example, alkali metals are prone to diffuse through organic layers due to their relatively small atomic radii, leading to device instability. In addition, alkali metals are difficult to process. Other dopants having both extremely high-lying HOMO levels and exhibiting air stability do not provide donors that are strong enough to obtain sufficient conductivity. In addition, the accessibility and implementation of dopants exhibiting low-lying LUMO energy levels has also been limited, and in particular for organic applications.

These and other issues remain as a challenge to a variety of methods, devices and systems that use or benefit from semiconductors.

SUMMARY

Various aspects of the present disclosure are directed to devices, methods and systems involving doped materials used in semiconductors, which address challenges including those discussed above.

An example embodiment of the present invention is directed to a semiconductor apparatus including a semiconductor material having an impurity that effects control of an electrical conductance of the semiconductor material. The impurity includes a compound including nitrogen and at least one of an H atom, an alkyl group, an aryl group, a heteroatom bonded group, and an sp3-hybridized and sp2-hybridized carbon atom bonded group.

Another example embodiment is directed to a method, in which a semiconductor material is doped using a salt-based material (e.g., a material that is formed from and/or includes a salt). The salt-based material includes at least one of an H atom, an alkyl group, an aryl group, a heteroatom bonded group, and an sp3-hybridized and sp2-hybridized carbon atom bonded group. The salt-based material is introduced to the semiconductor material (e.g., by mixing, evaporating and/or physical layer contact), and the salt-based material is heated to form a neutral compound that dopes the semiconductor material.

Another example embodiment is directed to a method of using an apparatus including a semiconductor material doped with a salt-based compound therein. The compound includes nitrogen and at least one of an H atom, an alkyl group, an aryl group, a heteroatom bonded group, and an sp3-hybridized and sp2-hybridized carbon atom bonded group. A voltage is applied to the doped semiconductor material, and the compound is used to control an electrical conductance of the semiconductor material, responsive to the applied voltage.

These and other approaches can be implemented with a variety of semiconductors. For example, salt-based dopants are implemented with one or more of organic materials, carbon nanotubes, graphene sheets, organic thin-film transistors, organic light-emitting diodes (OLEDs), and organic photovoltaics (OPVs), in accordance with various example embodiments.

The above summary is not intended to describe each embodiment or every implementation of the present disclosure. The figures and detailed description that follow more particularly exemplify various embodiments.

BRIEF DESCRIPTION OF THE DRAWINGS

Aspects of the invention may be more completely understood in consideration of the following detailed description of various embodiments of the invention in connection with the accompanying drawings, in which.

Figure 1:
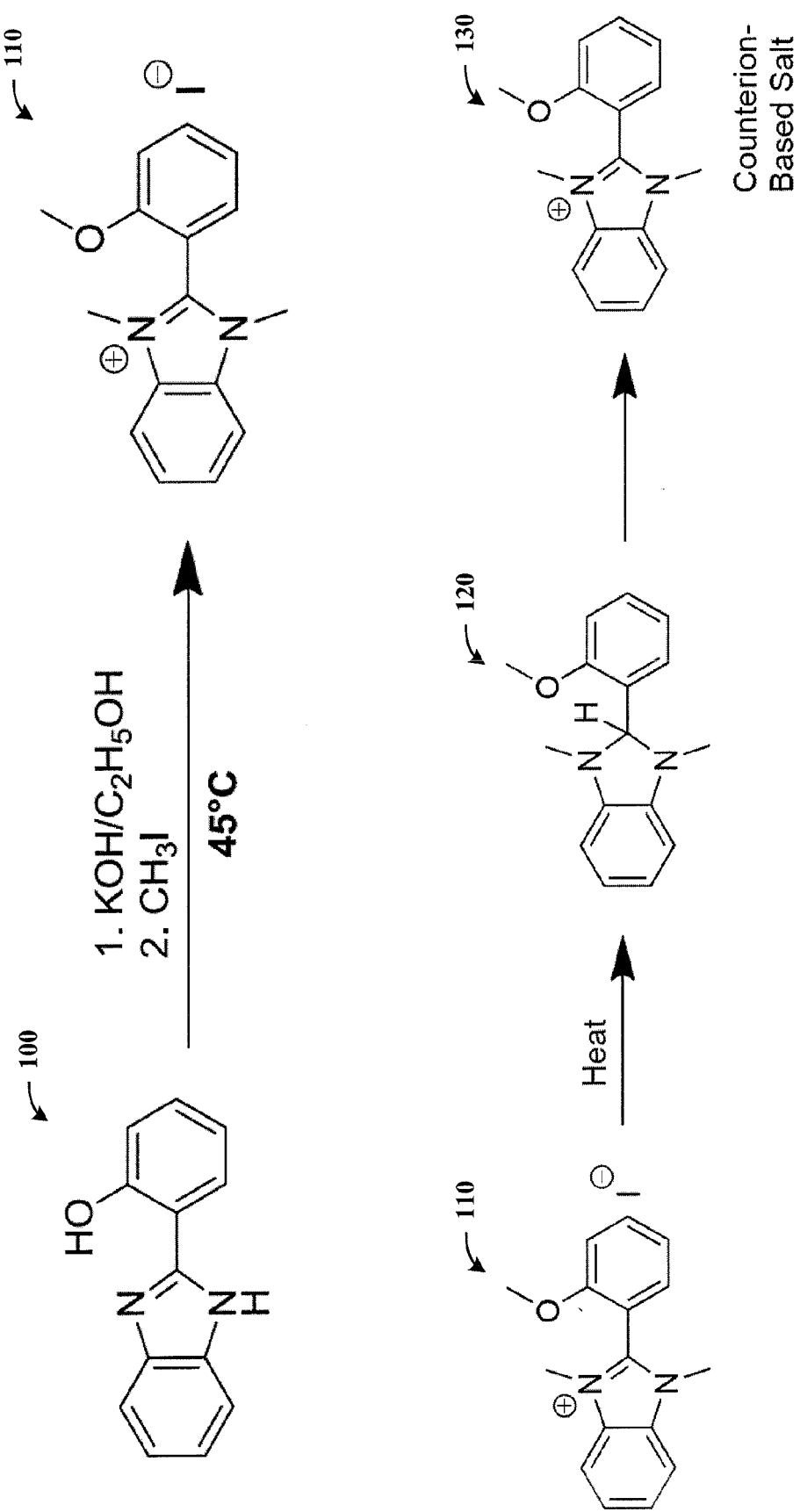
FIG. 1 shows an approach for fabricating a dopant and doping a semiconductor device, in accordance with an example embodiment.

While aspects of the invention are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

DETAILED DESCRIPTION

The present disclosure is related to methods, applications and devices in and stemming from the disclosure herein alone and/or in combination with aspects of the above-referenced patent document(s) to which priority is claimed, and also to uses and development of electronic devices and structures, including, but not limited to, doped electronic devices, organic devices, dopant precursors, dopants, and related materials and methods. Thus, the various embodiments and specific applications may be implemented in connection with one or more of the above-described aspects, embodiments and implementations, as well as with those shown in the figures.

In accordance with a particular example embodiment, an apparatus includes a semiconductor material having a compound configured and arranged as an impurity that effects control of an electrical conductance of the semiconductor material. The compound includes nitrogen and at least one of an H atom, an alkyl group, an aryl group, a heteroatom bonded group, and an sp3-hybridized and sp2-hybridized carbon atom bonded group.

Another example embodiment is directed to a method for manufacturing a semiconductor device. A salt-based material such as described above is introduced to a semiconductor material, and heated to form a neutral compound that is used to dope the semiconductor material. In some implementations, the neutral compound is generated without generating a neutral radical (e.g., forming o-MeO-DMBI by reducing o-MeO-DMBI-I via evaporation to remove I).

The neutral compound is generated using one or more approaches. For example, in one embodiment the compound is formed from a layer of salt-based material, or by mixing the salt-based material with a semiconductor and generating the neutral compound after mixing (e.g., in which some or all of the salt is converted to the neutral compound). In another embodiment, the salt-based material is vacuum deposited while heating the salt-based material to sublime the salt-based material and form the neutral compound.

Various embodiments are directed to materials usable as organic dopants or dopant precursors in devices such as organic electronic devices, carbon nanotube (CNT) and graphene devices. In certain implementations, such materials are implemented in a solution-processable form, or a form that facilitates implementation with a semiconductor material via layer formation and/or evaporation.

Another example embodiment is directed to a method of using an apparatus having a semiconductor material with a salt-based compound therein. The salt-based compound includes nitrogen and at least one of an H atom, an alkyl group, an aryl group, a heteroatom bonded group, and an sp3-hybridized and sp2-hybridized carbon atom bonded group. A voltage is applied to the doped semiconductor material, and the compound is used to control an electrical conductance of the semiconductor material, responsive to the applied voltage.

In various embodiments, one or more approaches herein are carried out to dope semiconductors with LUMO levels as high or higher than −2.5 eV, −2.7 eV or −3.0 eV. These respective doping approaches for semiconductors at various LUMO levels can be effected by substituting portions of a compound used as a dopant and/or from which the dopant is generated, such as by adding electron-donating groups.

In some implementations, a salt-based compound as described and implemented herein is based on a 1,3-dimethyl-2-phenyl-2,3-dihydro-1H-benzoimidazole (DMBI) salt having released an ion. The DMBI salt includes constituents as follows. A first constituent has at least one of an sp3- and sp2-hybridized carbon atom bonded group. A second constituent includes at least one of an H atom, an alkyl group, an aryl group, a heteroatom bonded group, and sp3- and sp2-hybridized carbon atom bonded groups. Third and fourth constituents respectively include at least one of an H atom, a methyl group, an alkyl group, an aryl group and a heteroatom bonded group. A fifth constituent includes at least one of an inorganic and organic ion.

In connection with certain embodiments, one or more of the following structures is used as a dopant source.

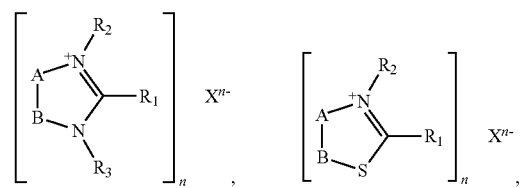

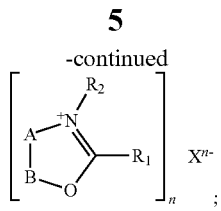

In each of these structures, A and B include at least one of sp3- and sp2-hybridized carbon atoms. R1 includes at least one of an H atom, an alkyl group, an aryl group, an sp3- and sp2-hybridized carbon atom bonded group, and a heteroatom bonded group. R2 and R3 each include at least one of an H atom, a methyl group, an alkyl group, an aryl group and a heteroatom bonded group. X includes at least one of an inorganic and organic ion.

The above structures are processed under heat to release the ion X and dope a semiconductor material. This approach may involve, for example, forming a device having the dopant source and a neutral compound corresponding to the dopant source, with the ion removed. This neutral compound is used to effect control of an electrical conductance within a semiconductor material.

In connection with the above or other example embodiments, one or more of the following structures is implemented as a dopant source (e.g., precursor):

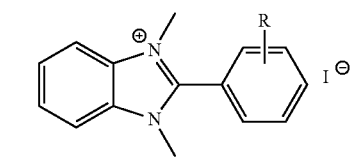

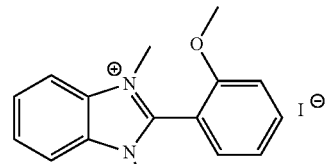

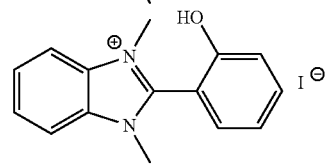

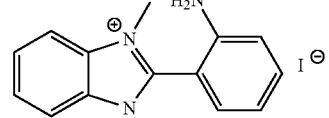

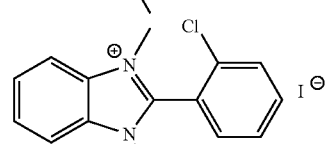

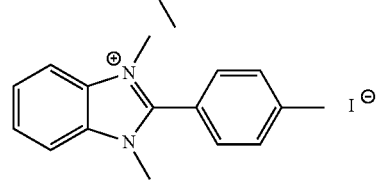

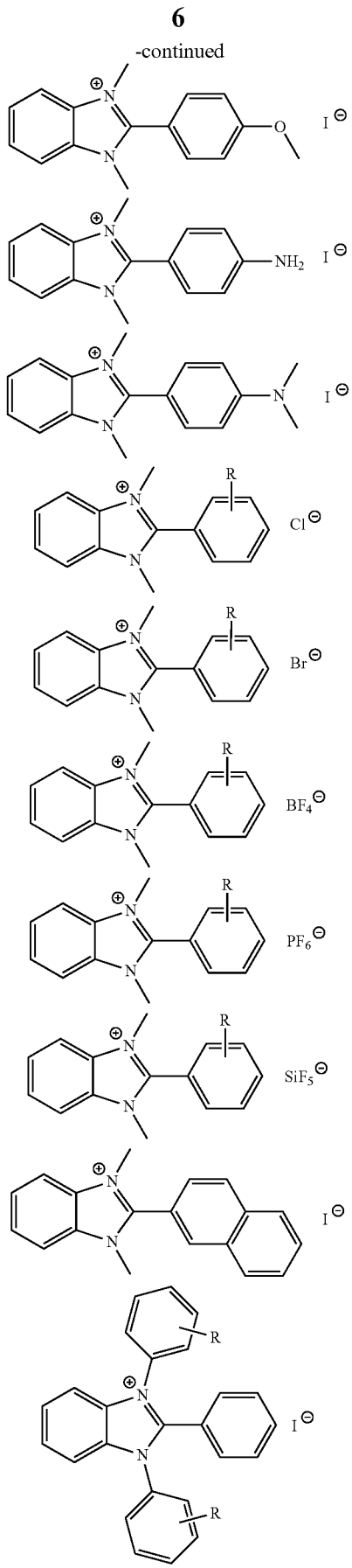

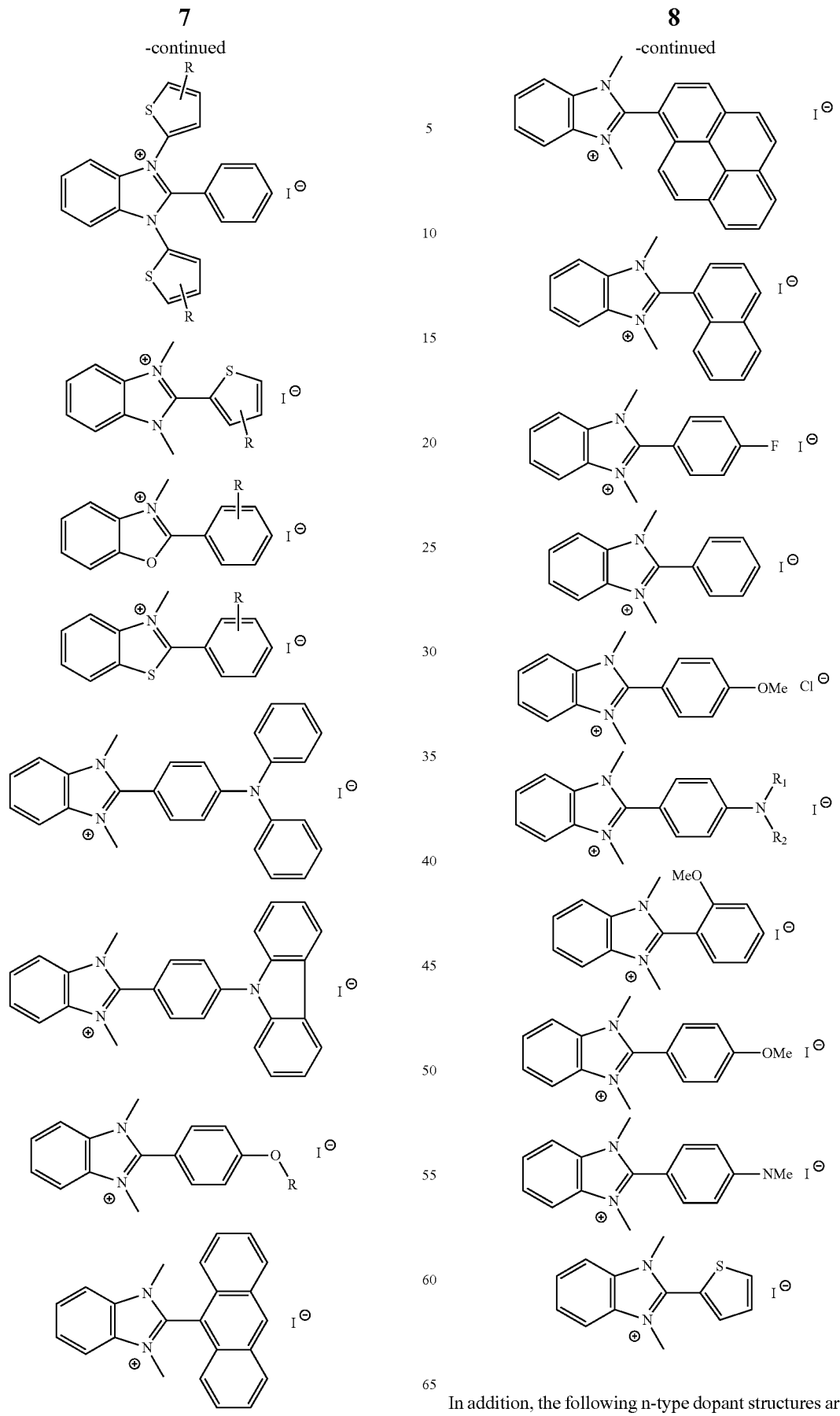
In addition, the following n-type dopant structures are implemented in connection with various embodiments.

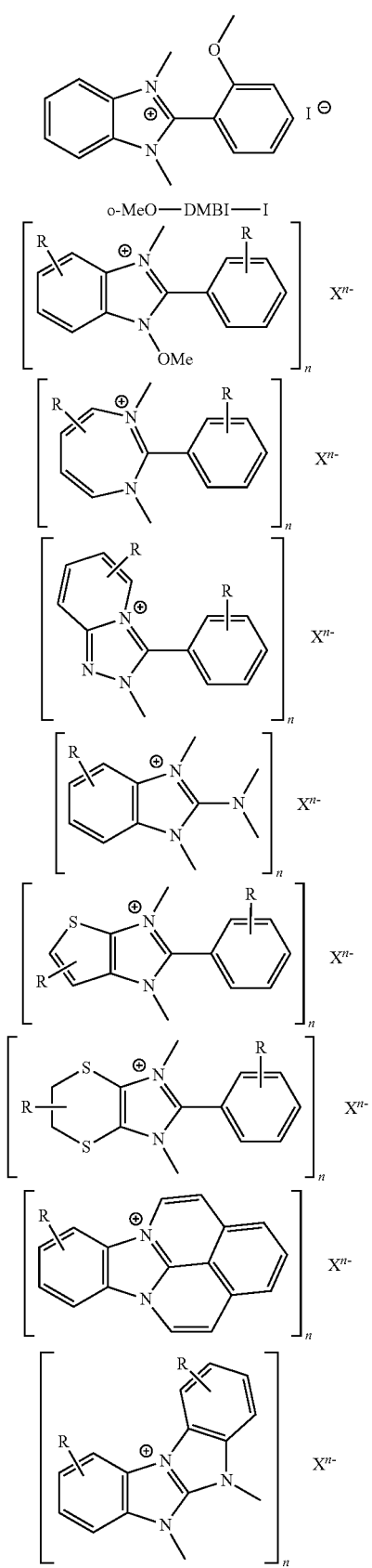

X = Cl, Br, I, BF$_4$, PF$_6$, SiF$_5$

In various example embodiments, the structures are formed using a doping effect via the following mechanism:

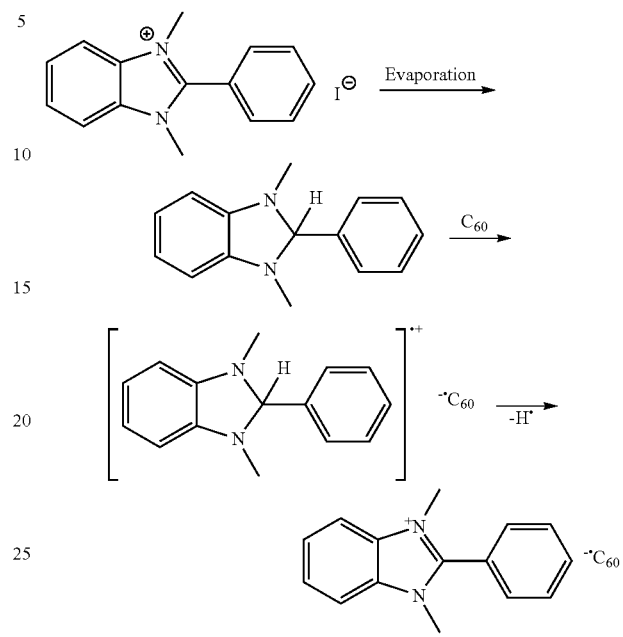

The dopants are reduced to a neutral form during evaporation in a vacuum chamber followed by an electron transfer reaction. In connection with these embodiments, it has been discovered that no neutral radical intermediate such as

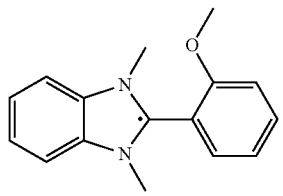 [SMILES: COc1ccccc1C1N(C)c2ccccc2N1C]

is formed as the active doping species. For general information regarding doping approaches and resulting structures, and for specific information regarding reducing dopants to a neutral form and/or reacting via electron transfer, reference may be made to aspects of U.S. Pat. No. 9,133,130, such as the discussion and apparatus shown in connection with the doping of a semiconductor device in FIGS. 1A-1F as additional embodiments, and which are fully incorporated herein by reference.

In accordance with one or more embodiments, 2-(2-methoxyphenyl)-1,3-dimethyl-1H-benzoimidazol-3-ium iodide (o-MeO-DMBI-I) is synthesized and employed to produce a strong n-type dopant for fullerene C$_{60}$. In some implementations, co-evaporated thin films are formed with such a dopant, to a conductivity of about 5.5 S/cm at a doping concentration of 8.0 wt % (14 mol %). In addition, o-MeO-DMBI-I can be stored and handled in air for extended periods without degradation, and is correspondingly implemented for various organic electronic devices. For general information regarding dopant-type materials and approaches, and for specific information regarding such dopants and approaches as may be implemented in connection with one or more example embodiments, reference may be made to Peng Wei, Torben Menke, Benjamin D. Naab, Karl Leo, Moritz Riede, and Zhenan Bao, "2-(2-Methoxyphenyl)-1,3-dimethyl-1H-benzoimidazol-3-ium Iodide as a New Air-Stable n-Type Dopant for Vacuum-Processed Organic Semiconductor Thin Films," *J. Am. Chem. Soc.,* 134 (9), pp. 3999-4002 (2012), which is, along with the published supporting information therefor and references cited therein, fully incorporated herein by reference.

In some embodiments, o-MeO-DMBI-I is formed from (4-(1,3-dimethyl-2,3-dihydro-1H-benzoimidazol-2-yl)phenyl)dimethylamine (N-DMBI) as a solution-processable dopant precursor with efficient n-type doping ability. For general information regarding such a solution-processable dopant, and for specific information regarding the formation and/or use of such a dopant as may be applicable to one or more embodiments, reference may be made to the above-referenced U.S. Pat. No. 9,133,130, and to Wei, P.; Oh, J. H; Dong, G.; and Bao, Z., "Use of a 1H-benzoimidazole derivative as an n-type dopant and to enable air-stable solution-processed n-channel organic thin-film transistors," J., Am. Chem. Soc. 132, 8852 (2010), which are fully incorporated herein by reference.

Turning now to the figures, FIG. 1 shows a chemical structure of o-MeO-DMBI-I and a synthetic processing route to prepare the material for use as a dopant in a semiconductor material, in accordance with another example embodiment of the present invention. Compound 100 is processed at about 45° C., with KOH/C$_2$H$_5$OH and methyl iodide, to form an o-MeO-DMBI-I compound 110, which is subsequently heated to form a neutral o-MeO-DMBI compound 120. Some of the compound 130 may also convert to a counterion-based salt 130.

This neutral compound 120 is used to dope a semiconductor material, and alter an electrical characteristic thereof. In some implementations, the compound 110 is formed in a layer and placed in contact with a semiconductor material. In other implementations, the compound 110 is co-evaporated with semiconductor material and forms the neutral compound 120 therein. In still other implementations, the compound 110 is mixed with a semiconductor material (e.g., in solution), and generates the neutral compound 120 (by heating) that dopes the semiconductor material after mixing, with applied heat as shown.

In connection with various embodiments, the approach shown in FIG. 1 is carried out using a large excess of methyl iodide (MeI) in forming 2-(2-methoxyphenyl)-1,3-dimethyl-1H-benzoimidazol-3-ium Iodide (o-MeO-DMBI-I), with the formation being carried out under low-pressure conditions (e.g., atmospheric pressure). Using this approach, a large quantity of a target compound, o-MeO-DMBI-I, can be produced in an air-stable form that can be stored and handled in air for extended periods without significant degradation.

Figures 2A, 2B:
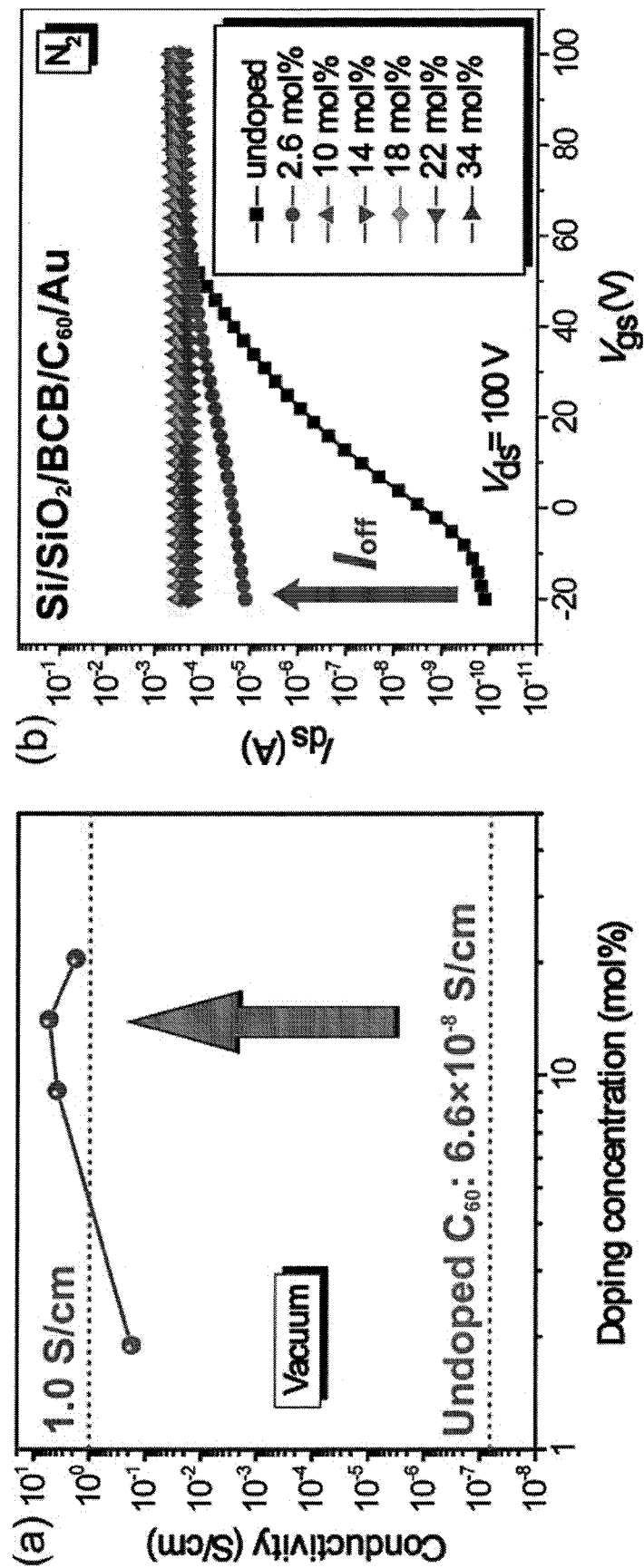
FIG. 2A is a plot showing conductance at different doping concentrations in a $C_{60}$ film, in accordance with other example embodiments of the present invention.
FIG. 2B is a plot showing transfer characteristics for an undoped film and doped films at various doping concentrations, in accordance with other example embodiments of the present invention.

Referring to FIG. 2A, conductivities are shown for an undoped C$_{60}$ film and o-MeO-DMBI-doped C$_{60}$ films at various doping concentrations. Referring to FIG. 2B, transfer characteristics of o-MeO-DMBI-doped C$_{60}$ OTFTs are shown, for various doping concentrations. In some embodiments, n-type doping of C$_{60}$ films to achieve conductivities as shown in FIG. 2A is carried out with a thin doped C$_{60}$ layer as follows. Co and o-MeO-DMBI-I are codeposited from separate sources at high vacuum to give 30 nm thick films. The o-MeO-DMBI-I is used to generate a neutral compound, o-MeO-DMBI, which is implanted or otherwise included with the C$_{60}$. Different doping concentrations are achieved for different applications by controlling the deposition rates of the matrix and dopant materials using separate quartz microbalances. Related transfer characteristics are shown in FIG. 2B.

The conductivity of the undoped C$_{60}$ film is about 6.6×10$^{-8}$ S/cm. Upon doping, the film conductivity is significantly increased by more than 7 orders of magnitude. In a particular embodiment, a high film conductivity of about 5.5 S/cm, is obtained using 8.0 wt % (14 mol %) doping. This strong n-type doping achieved using o-MeO-DMBI-I can be implemented for a variety of organic electronic device applications.

In another example embodiment, n-channel transistors are fabricated with a bottom-gate, top-contact configuration on n-doped silicon substrates, using o-MeO-DMBI-I to effect the doping of C$_{60}$ films (e.g., with 300 nm thick thermally grown SiO$_2$). The SiO$_2$ surface is passivated using a thin (20 nm), thermally cross-linked divinyltetramethyldisiloxane bis (benzocyclobutene) (BCB) layer to reduce/eliminate electron traps due to the surface hydroxyl groups on SiO$_2$. In a N$_2$-filled glovebox, the undoped C$_{60}$ transistors exhibit high average electron mobility of 4.02±0.35 cm$^2$ V$^{-1}$ s$^{-1}$ and an average on-off ratio of (4.68±1.04)×10$^6$. The doped transistors exhibit a significant decrease in the on-off ratio due to the increase in the off current, as consistent with FIG. 2B discussed above. In certain implementations, a 1.4 wt % (2.6 mol %) o-MeO-DMBI-I doping approach is used to form a device having a low on-off ratio of less than 100. At higher doping concentrations, devices can be formed with little gate-field-dependent characteristics and with on-off ratios of <10, such that the films can be essentially conductive.

Figures 3A, 3B:
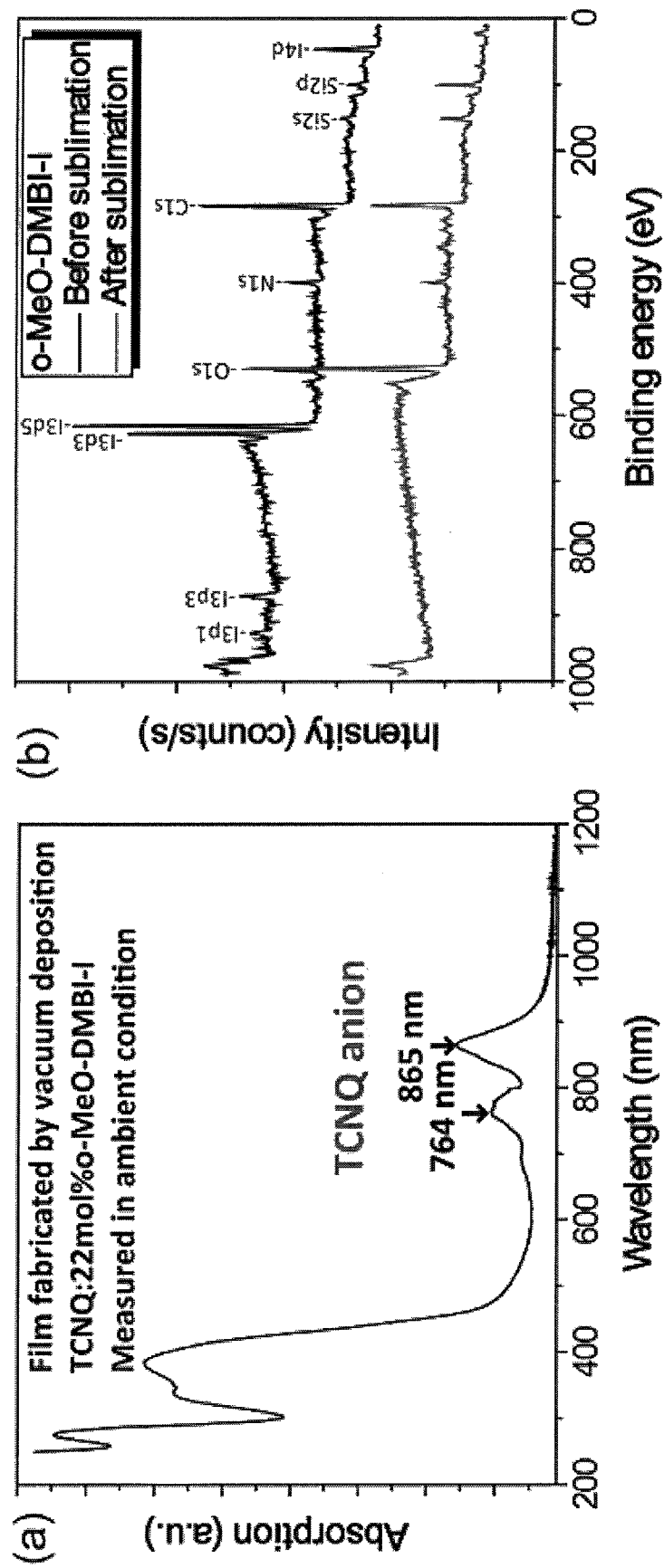
FIG. 3A shows UV-vis-NIR absorption spectrum of a 35 wt % (22 mol %) o-MeO-DMBI-doped TCNQ film, in accordance with another example embodiment of the present invention.
FIG. 3B shows XPS spectra of o-MeO-DMBI-I before and after sublimation at high vacuum, in accordance with other example embodiments of the present invention.

FIG. 3A shows UV-vis-NIR absorption spectrum of a 35 wt % (22 mol %) o-MeO-DMBI-doped 7,7,8,8-tetracyanoquinodimethane (TCNQ) film fabricated by vacuum deposition, in accordance with other example embodiments. In a particular embodiment, TCNQ, having a low LUMO level (−4.8 eV) is doped using o-MeO-DMBI-I. The o-MeO-DMBI-doped TCNQ films are fabricated by vacuum co-deposition at a doping concentration of 35 wt % (22 mol %). In the absorption spectra, the strong TCNQ anion peaks (764 and 865 nm) are achieved in air, as shown in FIG. 3A (indicating that efficient electron transfer from o-MeO-DMBI-I to TCNQ molecules occurs).

FIG. 3B shows XPS spectra of o-MeO-DMBI-I before and after sublimation at high vacuum, in accordance with other example embodiments. No iodide peak can be observed in the sublimed film, indicating the iodide is removed during evaporation.

Figure 4A:
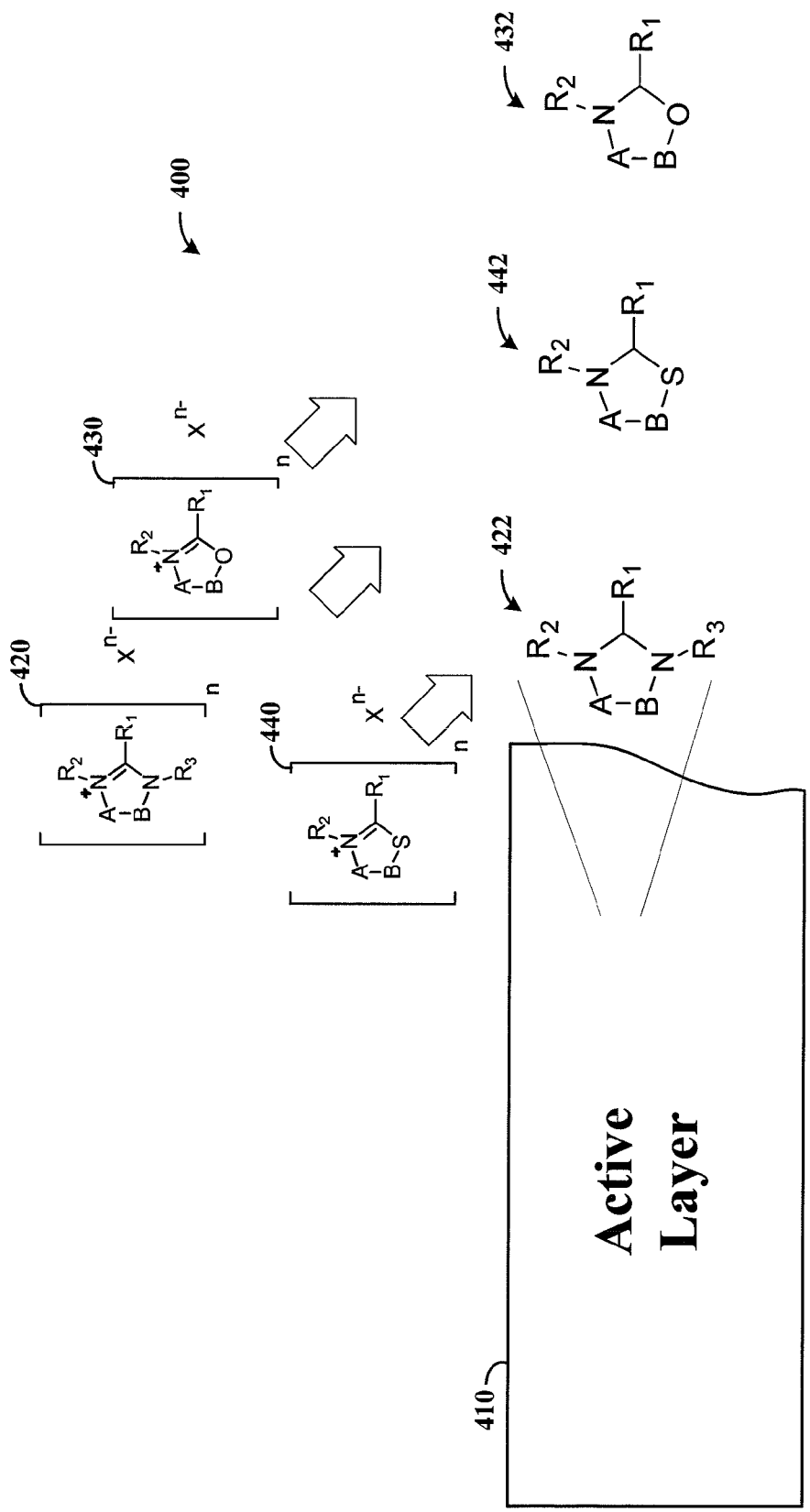
FIG. 4A shows a semiconductor material/device 400 having an active layer doped using a salt-based compound, in accordance with another example embodiment of the present invention.

FIG. 4A shows a semiconductor material/device 400 having an active layer 410 doped using a salt-based compound, in accordance with another example embodiment of the present invention. The active layer also includes one or more 1,3-dimethyl-2-phenyl-2,3-dihydro-1H-benzoimidazole (DMBI) material, shown by way of example via neutral materials 422, 432 and 442. Each of the neutral materials 422, 432 and 442 is doped in the active layer 410, respectively using salt-based based precursor materials 420, 430 and 440 (upon release of an ion therein).

The active layer 410 is implemented with a variety of different types of materials, to suit particular applications. In some embodiments, the active layer 410 includes a semiconductor material, such as an organic semiconductor material. In other embodiments, the active layer 410 is part of a carbon nanotube, or a graphene sheet. In various implementations, semiconductor material in the active layer 410 has a lowest unoccupied energy band of less than about −2.7 eV. These respective materials may also be implemented in connection with the embodiments shown in FIGS. 4C and 4D.

Figure 4B:
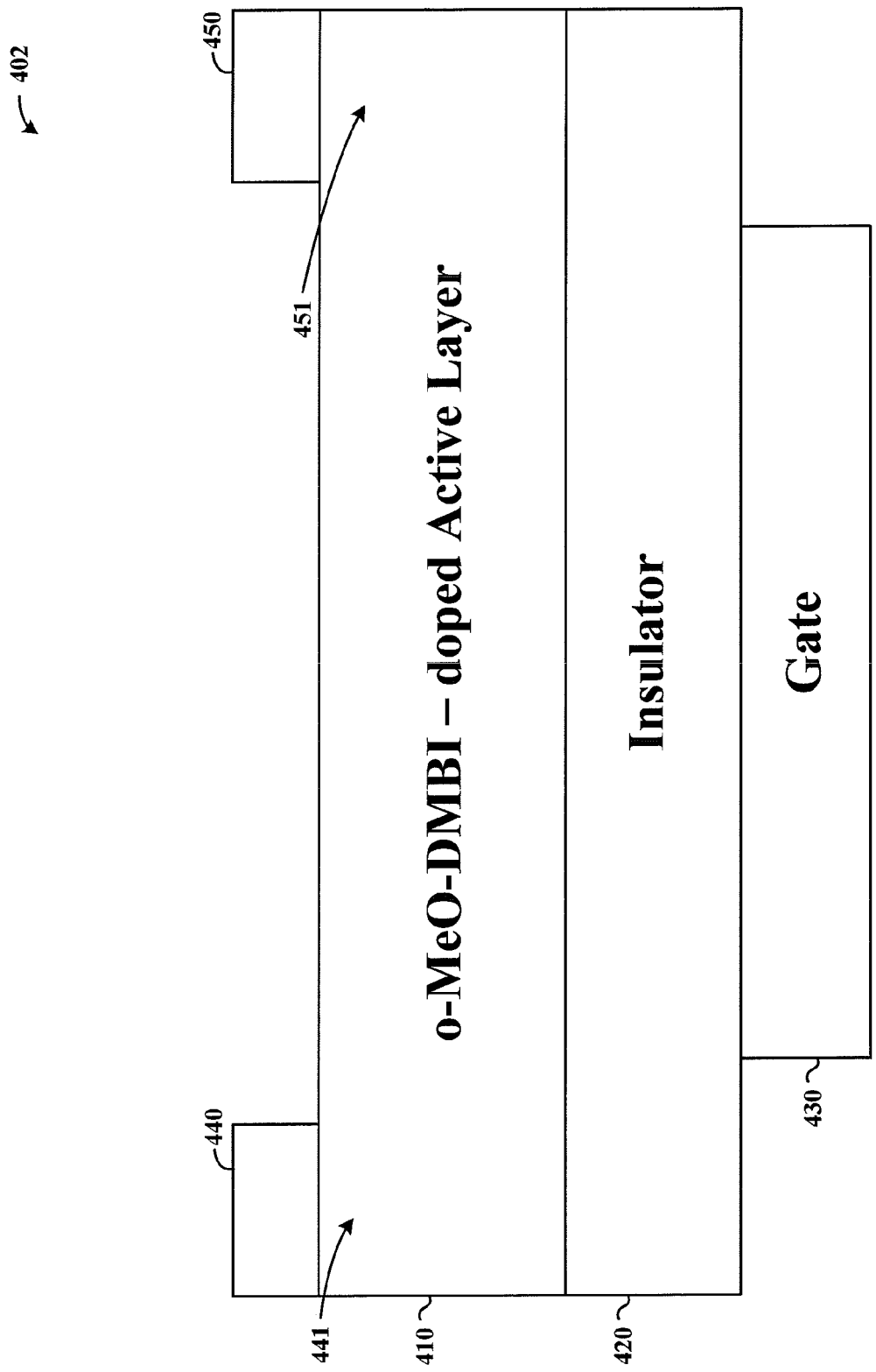
FIG. 4B shows a semiconductor device having an o-MeO-DMBI-doped active layer, in accordance with another example embodiment of the present invention.

FIG. 4B shows a semiconductor device 402 having an o-MeO-DMBI-doped active layer 410, in accordance with another example embodiment of the present invention. The device 402 also includes a back-gated structure including insulator 420 and gate 430, with respective electrodes 440 and 450 formed on the active layer 410. In some implementations, the o-MeO-DMBI dopant is concentrated and/or predominantly located under the respective electrodes 440 and 450 at 441 and 451, within the active layer 410 and/or at a surface thereof interfacing with the respective electrodes.

Figure 4C:
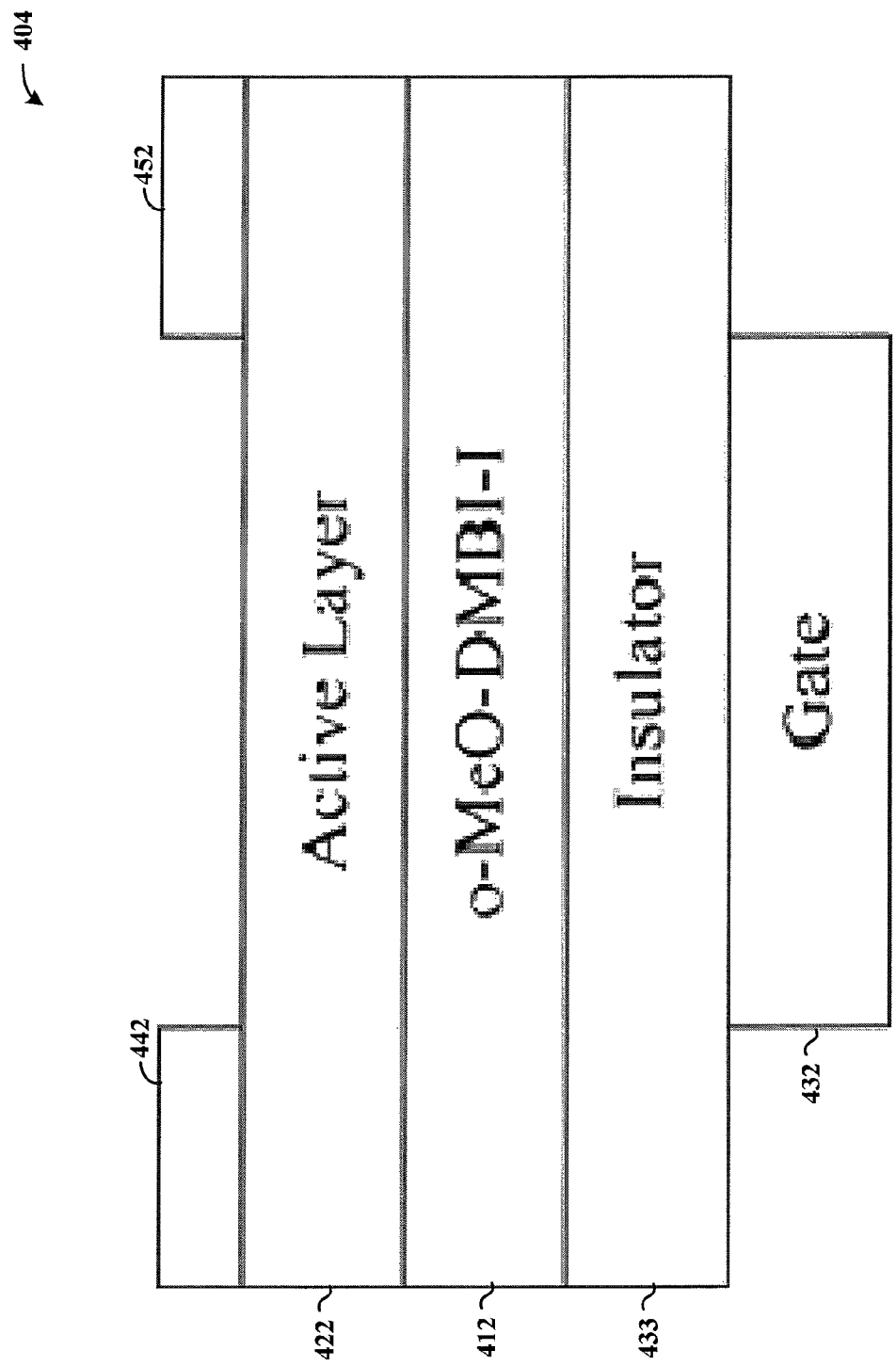
FIG. 4C shows a semiconductor device having an o-MeO-DMBI-I layer and a semiconductor active layer, in accordance with another example embodiment of the present invention.

FIG. 4C shows a semiconductor device 404 having an o-MeO-DMBI-I layer 412 and an o-MeO-DMBI-doped or undoped active layer 422 in accordance with another example embodiment of the present invention. The device 404 includes an o-MeO-DMBI-I layer 412 in contact with an active layer 422 (e.g., initially undoped $C_{60}$) on an underlying $SiO_2$ layer 433. Electrodes 442 and 452 are formed on the o-MeO-DMBI-I layer 412, and a (back) gate electrode 432 is formed on the $SiO_2$ layer 433 (or the $SiO_2$ layer is formed on the gate electrode). In some implementations, at least some of the o-MeO-DMBI-I layer 412 is mixed with the active layer 422.

During manufacture, the o-MeO-DMBI-I layer 412 operates to dope the active layer 422. This doping may be effected, for example, by heating the o-MeO-DMBI-I layer 412 to cause the release of the ion (I) and form o-MeO-DMBI, which acts as an impurity that alters an electrical characteristic of the active layer 422. Some of the o-MeO-DMBI may further convert to a counterion-based salt.

Figure 4D:
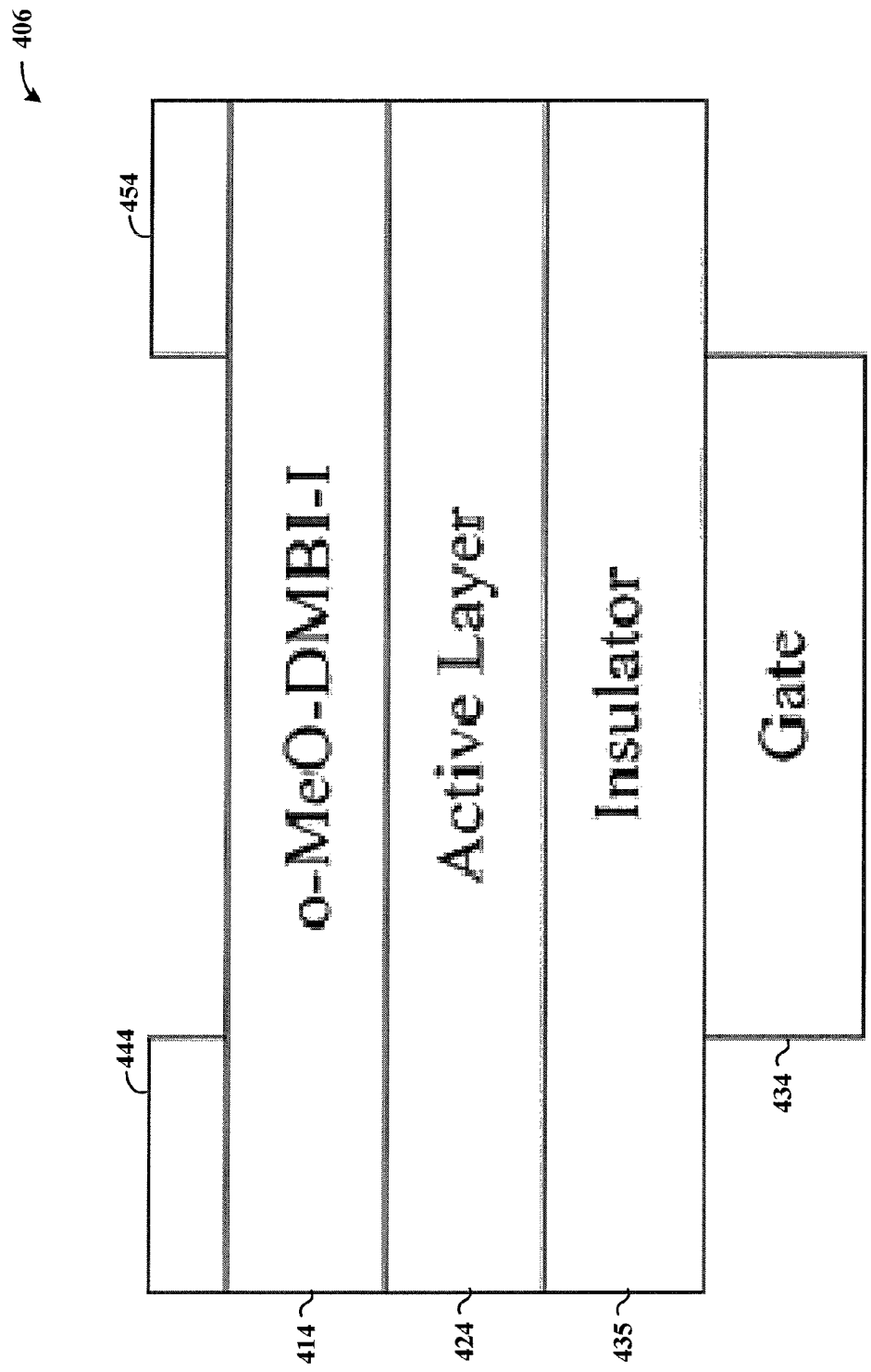
FIG. 4D shows a semiconductor device having an o-MeO-DMBI-I layer and a semiconductor active layer, in accordance with another example embodiment of the present invention.

FIG. 4D shows a semiconductor device 406 having an o-MeO-DMBI-I layer 414 and an o-MeO-DMBI-doped or undoped active layer 424, in accordance with another example embodiment of the present invention. The active layer 424 is separated from a gate electrode 434 by an insulator 435, and respective electrodes 444 and 454 are on the o-MeO-DMBI-I layer 414. The device 406 is similar to the device shown in FIG. 4C, with the o-MeO-DMBI-I layer 414 and the o-MeO-DMBI-doped active layer 424 flipped. In some implementations, at least some of the o-MeO-DMBI-I layer 414 is mixed with the active layer 424.

The o-MeO-DMBI-I layers as described herein (e.g., and shown in FIGS. 4C and 4D) are fabricated in accordance with one or more embodiments as discussed herein. In some implementations, a passivation layer including BCB (divinyltetramethyldisiloxane bis(benzocyclobutene)) is formed on a gate oxide and between the gate oxide and semiconductor material by spin-coating and thermal crosslinking. The semiconductor material can be formed by thermal deposition at high vacuum on the BCB passivated $SiO_2$ layer, and the o-MeO-DMBI-I layer can be thermally deposited directly on the top of the pure semiconductor layer.

Figure 5:
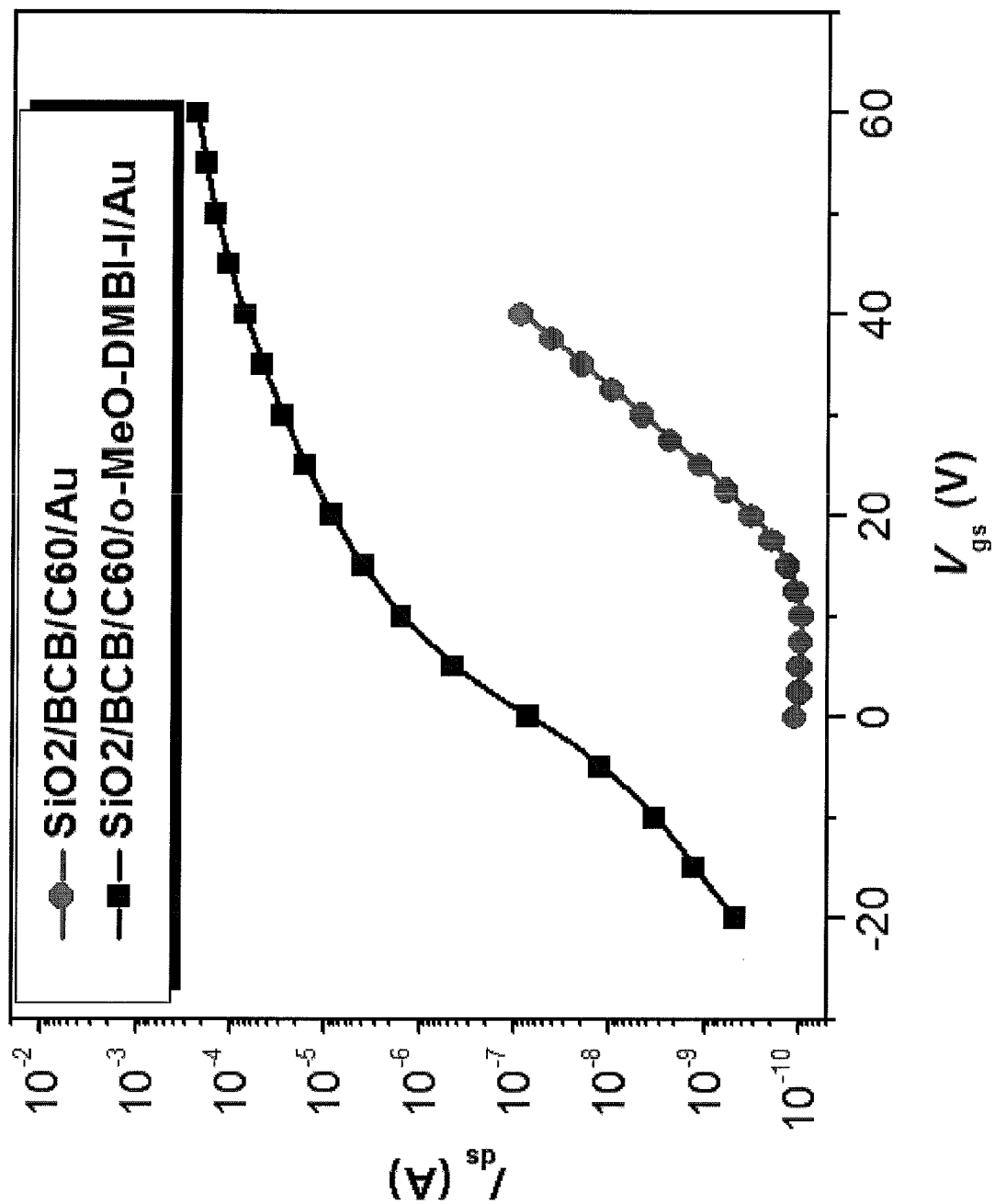
FIG. 5 shows plots of transfer characteristics of transistors with and without o-MeO-DMBI-I multilayer structures; in accordance with another example embodiment of the present invention.

FIG. 5 shows plots of transfer characteristics of $C_{60}$ OTFTs with and without o-MeO-DMBI-I multilayer structures, measured in an $N_2$ environment ($O_2$, $H_2O<0.1$ ppm), in accordance with another example embodiment. The transfer characteristics may, for example, be implemented with a transistor such as transistors 402, 404 and 406 respectively shown in FIGS. 4B, 4C and 4D. The threshold voltage $V_t$ of transistors can be used to evaluate the gate bias ($V_{gs}$) at which electron trap states have been filled and the carriers become mobile. From the transfer characteristics shown, $V_t$ is significantly decreased with the o-MeO-DMBI-I layer, from 30.38 V (a control $C_{60}$ transistor) to 15.07 V (an o-MeO-DMBI-I multilayer transistor, such as transistor 400).

The temperatures at which the salt-based materials as described herein are heated to form a neutral compound for doping can be set to suit the particular materials being used and resulting application. In some embodiments, these temperatures are in the range of 100° C.~300° C. depending on the property of the substitution and counterion, with examples shown in the following table as salt-based dopant materials (precursors) and related temperature ranges, as may be implemented to dope semiconductor materials as described herein.

| Salt-Based Material | Molecular Structure | Temperature (° C.) |
| --- | --- | --- |
| o-MeO-DMBI-I | | 140~230 |
| p-MeO-DMBI-Cl | | 130~190 |
| o-Cl-DMBI-I | | 140~230 |

-continued

| Salt-Based Material | Molecular Structure | Temperature (° C.) |
|---|---|---|
| DMBI-I | | 140~230 |
| p-MeO-DMBI-I | | 140~230 |
| DMBI-POH | | 100~150 |

In some embodiments, pentacene having a lowest unoccupied molecular orbital level of −3.0 eV is doped using an o-MeO-DMBI-I based salt to generate a neutral dopant by vacuum deposition. A passivation layer including BCB (divinyltetramethyldisiloxane bis(benzocyclobutene)) is located on a gate oxide and between the gate oxide and organic semiconductor material by spin-coating and thermal crosslinking. A 50-nm thick o-MeO-DMBI-I based doped film is formed as a layer on the organic semiconductor material, by thermally co-depositing the layer with two different sources at high vacuum on BCB passivated $SiO_2$ layers. Aluminum or another conductor is deposited on the doped and undoped pentacene films as source and drain electrodes. For the doped pentacene films, the doping concentration is 10 wt %, which is achieved by controlling the deposition rates of the two sources.

Figures 6A, 6B:
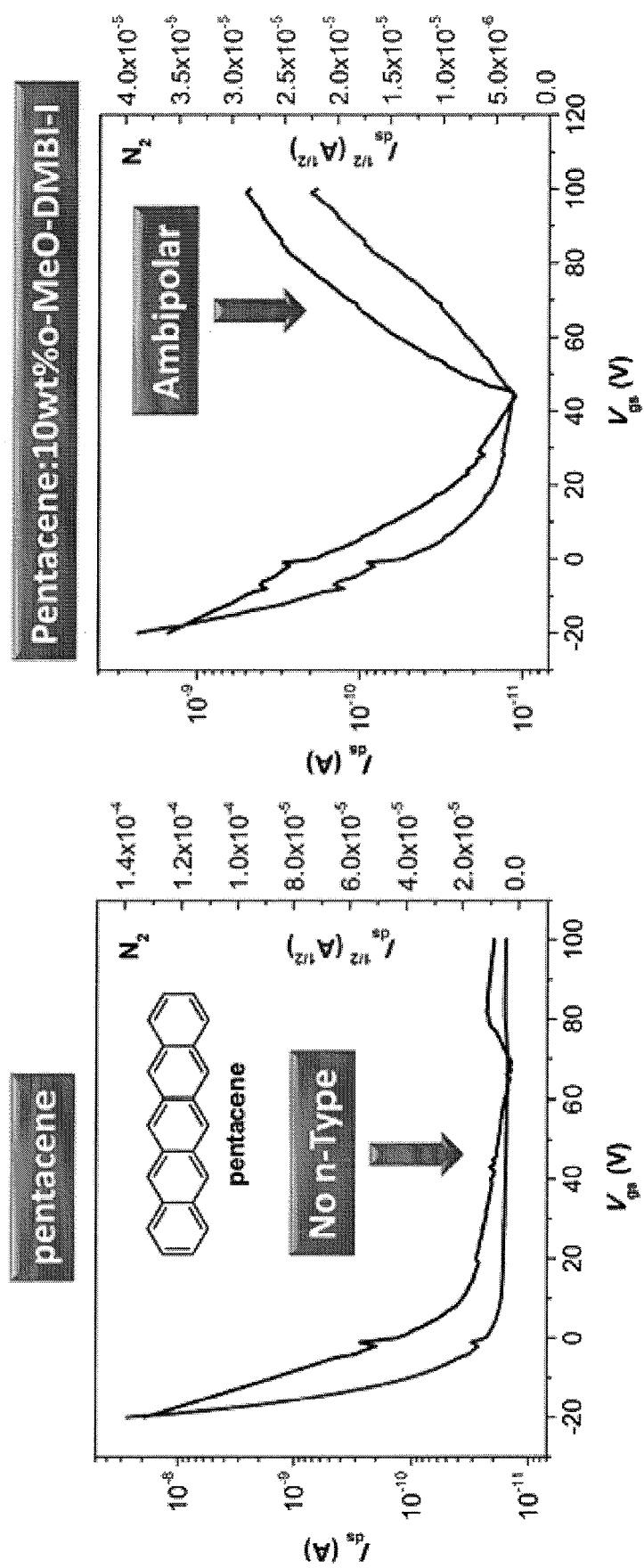
FIGS. 6A and 6B respectively show plots of transfer characteristics of undoped and doped pentacene transistors, in accordance with other example embodiments of the present invention.

As may be implemented using an approach as described above, FIGS. 6A and 6B respectively show plots of transfer characteristics of undoped and doped pentacene transistors, in accordance with other example embodiments of the present invention. Specifically, FIG. 6B shows transfer characteristics of 10 wt % o-MeO-DMBI-I doped pentacene transistor, measured in an $N_2$ environment ($O_2$, $H_2O$<0.1 ppm). The undoped pentacene transistor in FIG. 6A shows no n-type performance. A transistor formed using 10 wt % o-MeO-DMBI-I originated doping, as represented in FIG. 6B, exhibits ambipolar performance, indicating an n-type doping effect of o-MeO-DMBI on pentacene. With this approach, o-MeO-DMBI-I is used to facilitate n-type doping of pentacene having a LUMO level of about −3.0 eV.

Figure 7:
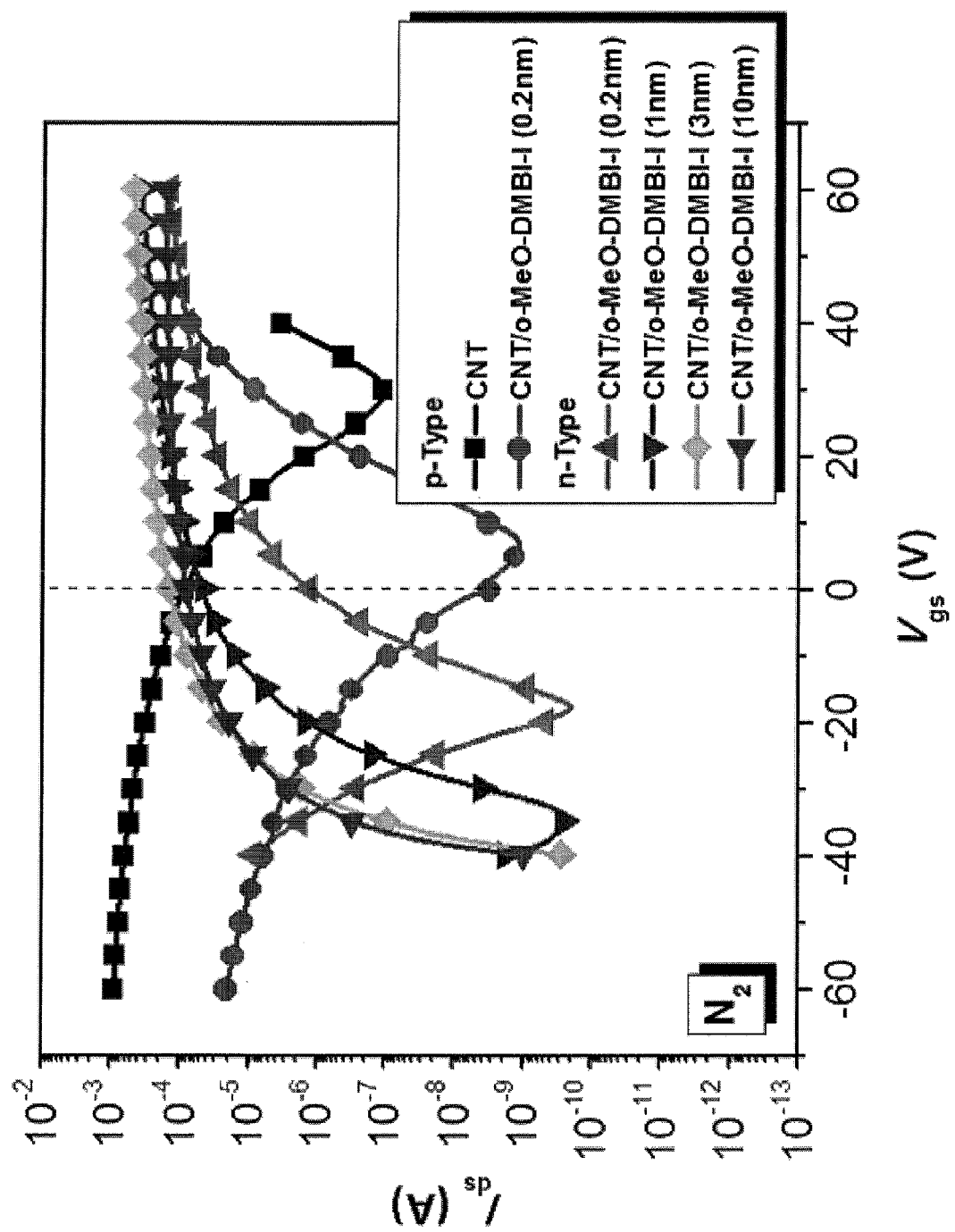
FIG. 7 shows plots of transfer characteristics of undoped and doped carbon nanotube transistors, in accordance with other example embodiments of the present invention.

In other example embodiments, carbon nanotube transistors are doped using an approach as described herein. FIG. 7 shows plots of transfer ($|V_{ds}|$=80 V) characteristics of undoped and carbon nanotube transistors doped using o-MeO-DMBI-I, as measured in an $N_2$ environment ($O_2$, $H_2O$<0.1 ppm), in accordance with a particular example embodiment. The o-MeO-DMBI-I is directly deposited on undoped carbon nanotube (CNT) transistors using a vacuum process. The undoped CNT transistor exhibited a high p-type performance with a mobility of 1.93±0.17 $cm^2$/Vs and on-off ratio of (7.56±1.62)×$10^3$. With about 0.2 nm o-MeO-DMBI-I on top of a CNT, it has been discovered that the transistors switch from unipolar p-type performance to ambipolar operation. The hole mobility is (9.43±2.80)×$10^{-2}$ $cm^2$/Vs, and the electron mobility is (5.28±1.09)×$10^{-1}$ $cm^2$/Vs. With thicker o-MeO-DMBI-I, the doped CNT transistors exhibited predominantly or only n-type characteristics. With this approach, o-MeO-DMBI-I can be used to efficiently n-type dope carbon nanotubes, using o-MeO-DMBI to tune the transporting properties of the CNTs.

Figure 8:
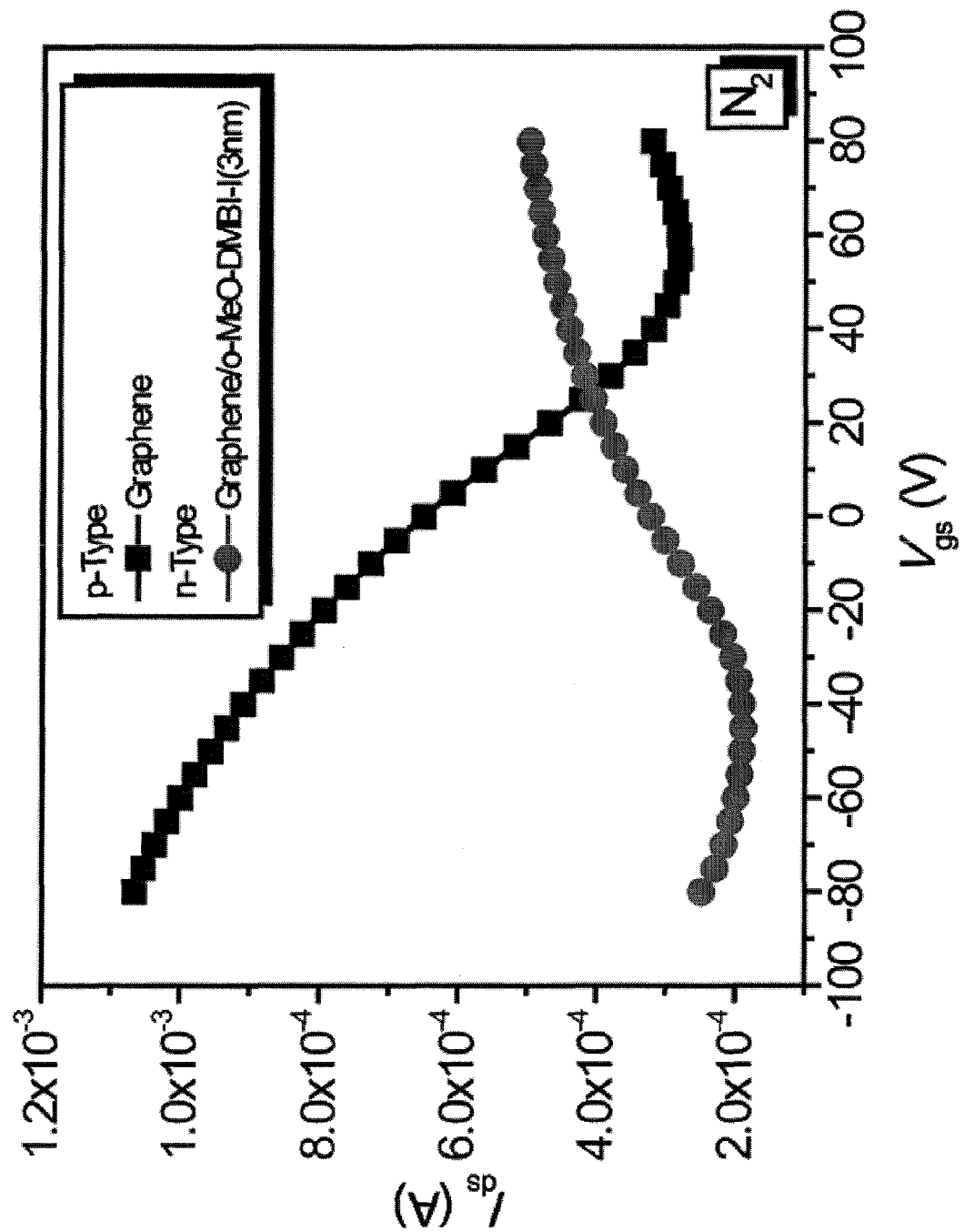
FIG. 8 shows plots of transfer characteristics of undoped and doped graphene transistors, in accordance with other example embodiments of the present invention.

Other embodiments are directed to the doping of graphene transistors, and the resulting transistors themselves. Accordingly, FIG. 8 shows the plots of transfer ($|V_{ds}|$=0.1 V) characteristics of undoped and o-MeO-DMBI-I doped graphene transistors, measured in an $N_2$ environment ($O_2$, $H_2O$<0.1 ppm), in accordance with other example embodiments of the present invention. A 3 nm layer of o-MeO-DMBI-I is directly deposited on undoped graphene transistors using a vacuum process. The o-MeO-DMBI-I is used to dope the graphene (e.g., by forming a neutral o-MeO-DMBI-based dopant as discussed herein). This doping is used to switch the transporting property of graphene from p-type to n-type. With this approach, o-MeO-DMBI-I can be used to efficiently n-type dope graphene and tune its transporting properties.

Various embodiments described above, and in the above-referenced provisional patent application may be implemented together and/or in other manners. One or more of these aspects can also be implemented in a more separated or integrated manner, as should be apparent and is useful in accordance with particular target applications. In view of the description herein, those skilled in the art will recognize that many changes may be made thereto without departing from the spirit and scope of the present invention.

What is claimed is:
1. An apparatus comprising:
 a compound including nitrogen in the form of a nitrogen atom, and at least one of an H atom, an alkyl group, an aryl group, a heteroatom bonded group, and an sp3-hybridized and sp2-hybridized carbon atom bonded group and a combination thereof; and
 a semiconductor material including the compound configured and arranged as an impurity that effects control of an electrical conductance of the semiconductor material, the semiconductor material further including an ion-based salt configured and arranged in a layer of the semiconductor material to convert into the compound to effect control of the electrical conductance, the compound being a neutral material that dopes the semiconductor material.

2. The apparatus of claim 1, wherein the ion-based salt includes a 1,3-dimethyl-2-phenyl-2,3-dihydro-1H-benzoimidazole (DMBI) based salt including:
   a first constituent including at least one of an sp3- and sp2-hybridized carbon atom bonded group,
   a second constituent including at least one of an H atom, an alkyl group, an aryl group, an heteroatom bonded group, and sp3- and sp2-hybridized carbon atom bonded groups,
   third and fourth constituents respectively including at least one of an H atom, a methyl group, an alkyl group, an aryl group, a heteroatom bonded group, and
   a fifth constituent including at least one of an inorganic and organic ion.

3. The apparatus of claim 1, wherein the ion-based salt is configured and arranged to chemically react by forming the compound as a compound that dopes the semiconductor material, and wherein the ion-based salt includes a material having a formula according to at least one of:

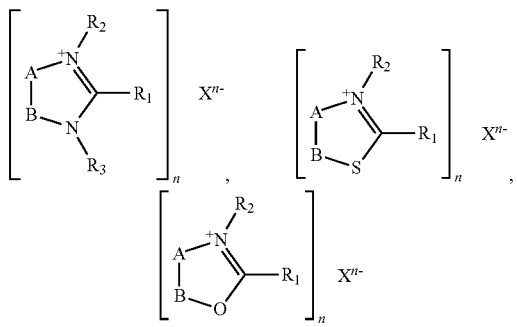

in which
   A and B include at least one of sp3- and sp2-hybridized carbon atoms,
   R1 includes at least one of an H atom, an alkyl group, an aryl group, an sp3- and sp2-hybridized carbon atom bonded group, and a heteroatom bonded group,
   R2 and R3 each include at least one of an H atom, a methyl group, an alkyl group, an aryl group and a heteroatom bonded group, and
   X includes at least one of an inorganic and organic ion.

4. The apparatus of claim 3, wherein the ion-based salt is configured and arranged to form the compound having a formula according tout least one of:

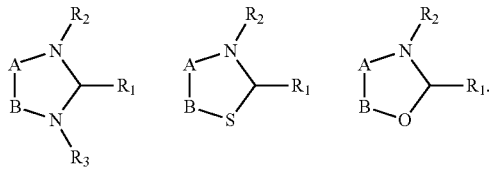

5. The apparatus of claim 1, wherein the compound is a material having a formula according to at least one of:

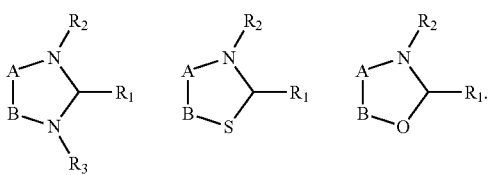

in which
   A and B include at least one of sp3- and sp2-hybridized carbon atoms,
   R1 includes at least one of an H atom, an alkyl group, an aryl group, an sp3- and sp2-hybridized carbon atom bonded group, and a heteroatom bonded group,
   R2 and R3 each include at least one of an H atom, a methyl group, an alkyl group, an aryl group and a heteroatom bonded group, and
   X includes at least one of an inorganic and organic ion.

6. The apparatus of claim 1, wherein the compound includes a material configured and arranged to effect the control of the electrical conductance of the semiconductor material.

7. The apparatus of claim 1, wherein the compound includes a material configured and arranged to convert into a counterion-based salt.

8. The apparatus of claim 1, wherein the semiconductor material has a lowest unoccupied energy band of less than about −2.7 eV.

9. The apparatus of claim 1, wherein the semiconductor material includes
   a counterion-based material converted from a neutral compound.

10. The apparatus of claim 1, wherein the semiconductor material includes an organic semiconductor.

11. The apparatus of claim 1, further including a compound derived from a compound having a formula according to at least one of

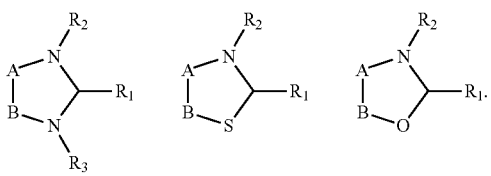

in which
   A and B include at least one of sp3- and sp2-hybridized carbon atoms,
   R1 includes at least one of an H atom, an alkyl group, an aryl group, an sp3- and sp2-hybridized carbon atom bonded group, and a heteroatom bonded group,
   R2 and R3 each include at least one of an H atom, a methyl group, an alkyl group, an aryl group and a heteroatom bonded group, and
   X includes at least one of an inorganic and organic ion.

12. The apparatus of claim 1, wherein the semiconductor material includes carbon nanotubes.

13. The apparatus of claim 1, wherein the semiconductor material includes graphene.

14. The apparatus of claim 1, wherein the semiconductor material includes nano-materials with a lowest unoccupied molecular orbital (LUMO) level of less than about −2.7 eV.

15. An apparatus comprising:

a compound including nitrogen in the form of a nitrogen atom, and at least one of an H atom, an alkyl group, an aryl group, a heteroatom bonded group, and an sp3-hybridized and sp2-hybridized carbon atom bonded group and a combination thereof;

a semiconductor material including the compound configured and arranged as an impurity that effects control of an electrical conductance of the semiconductor material; and a salt-based precursor configured and arranged to chemically react by forming the compound as a compound that dopes the semiconductor material, the salt-based precursor including at least one of:

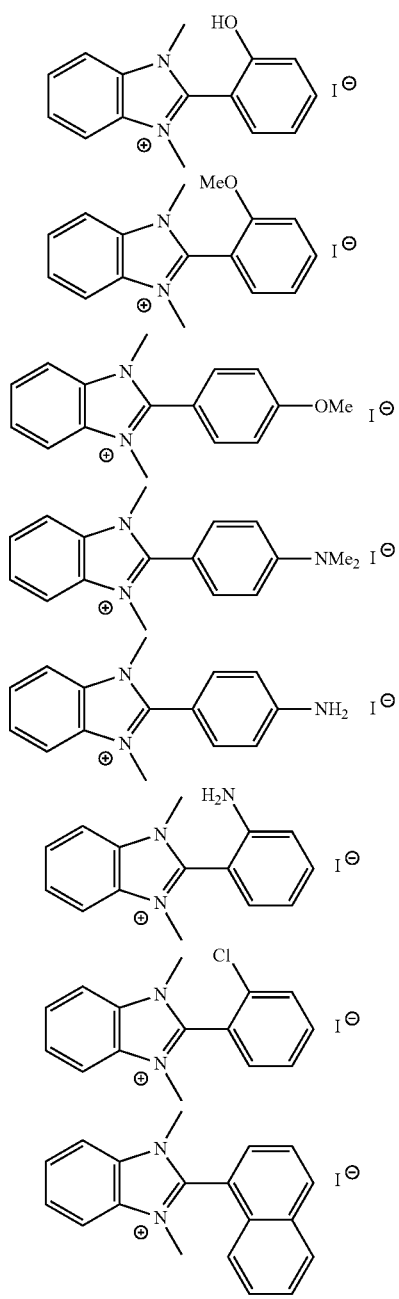

-continued

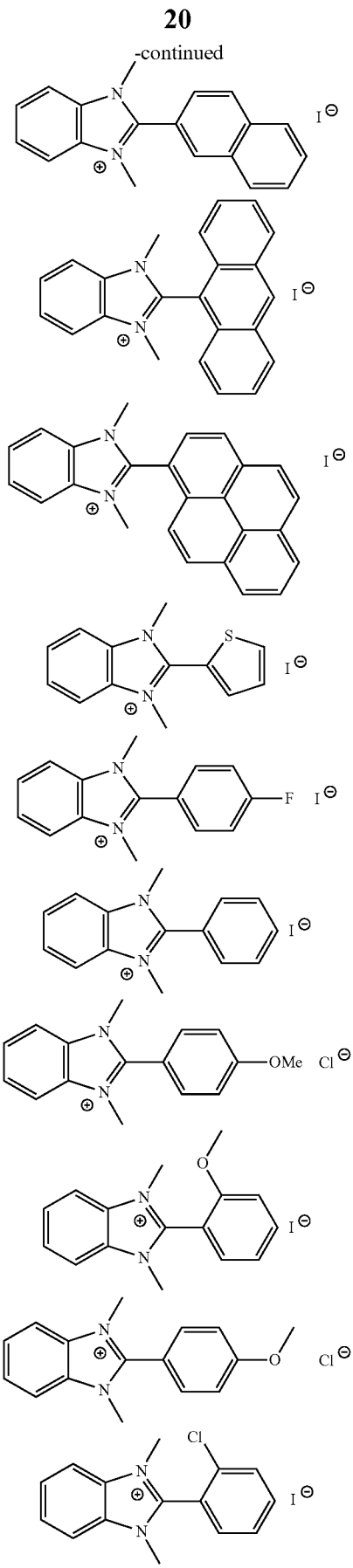

-continued

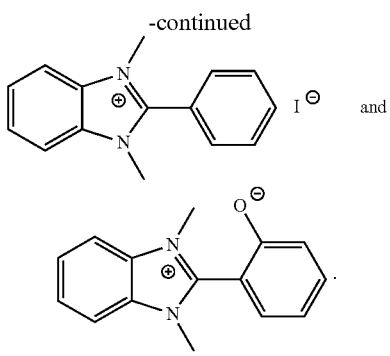

and

16. An apparatus comprising:
a compound including nitrogen in the form of a nitrogen atom, and at least one of an H atom, an alkyl group, an aryl group, a heteroatom bonded group, and an sp3-hybridized and sp2-hybridized carbon atom bonded group and a combination thereof; and
a semiconductor material including the compound configured and arranged as an impurity that effects control of an electrical conductance of the semiconductor material, wherein the compound includes a 2-(2-methoxyphenyl)-1,3-dimethyl-2,3-dihydro-1H-benzoimidazole (o-MeO-DMBI) dopant configured and arranged to effect the control of the electrical conductance of the semiconductor material.

17. An apparatus comprising:
a compound including nitrogen in the form of a nitrogen atom, and at least one of an H atom, an alkyl group, an aryl group, a heteroatom bonded group, and an sp3-hybridized and sp2-hybridized carbon atom bonded group and a combination thereof;
a semiconductor material including the compound configured and arranged as an impurity that effects control of an electrical conductance of the semiconductor material; and
wherein the semiconductor material includes compound material manifested in the semiconductor material due to 2-(2-methoxyphenyl)-1,3-dimethyl-1H-benzoimidazol-3-ium iodide (o-MeO-DMBI-I) being introduced to the semiconductor material, wherein the compound material includes o-MeO-DMBI without a neutral radical.

18. An apparatus comprising:
a compound including nitrogen in the form of a nitrogen atom, and at least one of an H atom, an alkyl group, an aryl group, a heteroatom bonded group, and an sp3-hybridized and sp2-hybridized carbon atom bonded group and a combination thereof; and
a semiconductor material including the compound configured and arranged as an impurity that effects control of an electrical conductance of the semiconductor material, wherein the semiconductor material includes o-MeOD-MBI-I.

19. An apparatus comprising:
a compound including nitrogen in the form of a nitrogen atom, and at least one of an H atom, an alkyl group, an aryl group, a heteroatom bonded group, and an sp3-hybridized and sp2-hybridized carbon atom bonded group and a combination thereof; and
a semiconductor material including the compound configured and arranged as an impurity that effects control of an electrical conductance of the semiconductor material, wherein the semiconductor material includes an unconverted portion of o-MeO-DMBI as a dopant in the semiconductor material.

20. An apparatus comprising:
a compound including nitrogen in the form of a nitrogen atom, and at least one of an H atom, an alkyl group, an aryl group, a heteroatom bonded group, and an sp3-hybridized and sp2-hybridized carbon atom bonded group and a combination thereof;
a semiconductor material including the compound configured and arranged as an impurity that effects control of an electrical conductance of the semiconductor material; and
wherein the-semiconductor material includes a film including therein a compound derived from a salt-based material, wherein the film is on the semiconductor material.

21. The apparatus of claim 20, wherein the compound is derived from a salt-based material that has a formula according to at least one of:

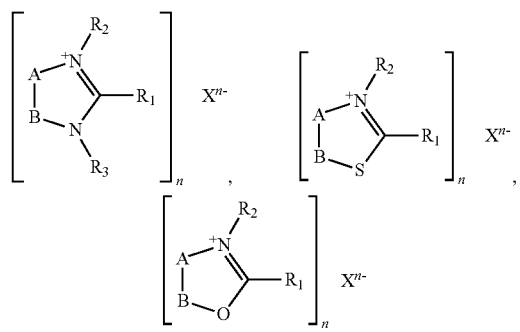

in which
A and B include at least one of sp3- and sp2-hybridized carbon atoms,
R1 includes at least one of an H atom, an alkyl group, an aryl group, an sp3- and sp2-hybridized carbon atom bonded group, and a heteroatom bonded group,
R2 and R3 each include at least one of an H atom, a methyl group, an alkyl group, an aryl group and a heteroatom bonded group.

22. The apparatus of claim 21, wherein the compound is derived from a compound having a formula according to at least one of:

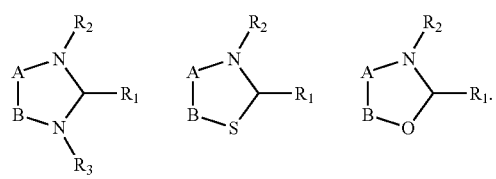

* * * * *